US009503126B2

(12) United States Patent
Vardy et al.

(10) Patent No.: US 9,503,126 B2
(45) Date of Patent: Nov. 22, 2016

(54) ECC POLAR CODING AND LIST DECODING METHODS AND CODECS (71) Applicant: The Regents of the University of California, Oakland, CA (US)

(72) Inventors: Alexander Vardy, Escondido, CA (US); Ido Tal, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 617 days.

(21) Appl. No.: 13/938,609

(22) Filed: Jul. 10, 2013

(65) Prior Publication Data
US 2014/0019820 A1 Jan. 16, 2014

Related U.S. Application Data (60) Provisional application No. 61/670,381, filed on Jul. 11, 2012.

(51) Int. Cl.
*H03M 13/00* (2006.01)
*H03M 13/13* (2006.01)
*H03M 13/45* (2006.01)
*H03M 13/09* (2006.01)

(52) U.S. Cl.
CPC ........... *H03M 13/13* (2013.01); *H03M 13/451* (2013.01); *H03M 13/09* (2013.01)

(58) Field of Classification Search
CPC ........ G06F 11/00; G06F 12/02; G06F 17/10; H03M 13/00; H03M 13/05; H03M 13/111; H03M 13/1191; H03M 13/13; H03M 13/15; H03M 13/29; H03M 13/37; H03M 13/45; H03M 13/451; H04L 1/00
See application file for complete search history.

(56) References Cited

U.S. PATENT DOCUMENTS 9,176,927 B2  11/2015  Gross et al.
2012/0054576 A1*  3/2012  Gross ................. H03M 13/1117
                                                    714/752

OTHER PUBLICATIONS

Tal, Ido et al., "List Decoding of Polar Codes," Jul. 31, 2011 IEEE International Symposium of Information Theory Proceedings, pp. 1-5.*
Kim, Jong-hwan et al., "Rate-Adaptive Polar Codes for Distributed Source Coding", Feb. 20-22, 2012, ICUIMC Kuala Lumur, Malayasia., pp. 1-5.*

(Continued)

*Primary Examiner* — Sam Rizk
*Assistant Examiner* — Enamul M Kabir
(74) *Attorney, Agent, or Firm* — Greer, Burns & Crain, Ltd.; Steven P. Fallon (57) ABSTRACT A method of decoding data encoded with a polar code and devices that encode data with a polar code. A received word of polar encoded data is decoded following several distinct decoding paths to generate a list of codeword candidates. The decoding paths are successively duplicated and selectively pruned to generate a list of potential decoding paths. A single decoding path among the list of potential decoding paths is selected as the output and a single candidate codeword is thereby identified. In another preferred embodiment, the polar encoded data includes redundancy values in its unfrozen bits. The redundancy values aid the selection of the single decoding path. A preferred device of the invention is a cellular network device, (e.g., a handset) that conducts decoding in accordance with the methods of the invention.

13 Claims, 5 Drawing Sheets (56) References Cited

OTHER PUBLICATIONS

Arikan, E., et. al., "Channel polarization: A method for constructing capacity-achieving codes for symmetric binary-input memoryless channels", *IEEE Trans. Inform. Theory*, vol. 55, No. 7, Jul. 2009, pp. 3051-3073.

Arikan, E., et. al., "On the rate of channel polarization" in *Proc. IEEE Int'l Symp. Inform. Theory (ISIT 2009)*, Seoul, South Korea, 2009, pp. 1493-1495.

Arikan, E., et. al., "Systematic Polar Coding", *IEEE Communications Letters*, vol. 15, No. 8, Aug. 2011, pp. 860-862.

Cormen, T.H., et. al., *Introduction to Algorithms* Chapters 9 and 10 only, 2nd ed., Cambridge, Massachusetts, United States, *The MIT Press*, 2001 (32 pages).

Dumer, I, et. al., "Soft-decision decoding of Reed-Muller codes: recursive lists", *IEEE Trans. Inform. Theory*, vol. 52, No. 3, Mar. 2006, pp. 1206-1266.

Korda, Satish Babu, et. al., "Polar Codes Characterization of Exponent, Bounds and Constructions", *IEEE Trans. Inform. Theory*, vol. 56, 2010, pp. 6253-6264.

Leroux, Camille, et. al., "Hardware Architectures for Successive Cancellation Decoding of Polar Codes", arXiv:1O11.2919v1 [cs.AR], Nov. 12, 2010, pp. 1665-1668.

Peterson, W.W., et. al., *Error-Correcting Codes*, Chapter 7 only, 2nd ed., Cambridge, Massachusetts, United States, *The MIT Press*, 1972, pp. 107-123.

Polyanskiy, Yury, et. al., "Channel Coding Rate in the Finite Blocklength Regime", *IEEE Transactions on Information Theory*, vol. 56, No. 5, May 2010, pp. 2307-2359.

Tal, Ido, et. al., "How to Construct Polar Codes", arXiv:1105.6164v3 [cs.IT], Apr. 10, 2013, pp. 1-21.

TURBOBEST, "IEEE 802.16e LDPF Encoder/Decoder Core", [Online] http://www.turbobest.com/tb_ldpc80216e.htm, date unknown.

Weichmann, Gil et. al., Án Improved Sphere-Packing Bound for Finite-Length Codes over Symmetric Memoryless Channels *IEEE Trans. Inform. Theory*, vol. 54, Issue 5, May 2008, pp. 1962-1990.

\* cited by examiner

ECC POLAR CODING AND LIST DECODING METHODS AND CODECS

PRIORITY CLAIM AND REFERENCE TO RELATED APPLICATION

The application claims priority under 35 U.S.C. §119 from prior provisional application Ser. No. 61/670,381, which was filed Jul. 11, 2012, which application is incorporated by reference herein.

STATEMENT OF GOVERNMENT INTEREST

This invention was made with government support under CCF-1116820 awarded by National Science Foundation. The government has certain rights in the invention.

FIELD

A field of the invention is information coding and decoding. The invention is particularly useful for communication over noisy mediums. Example applications of the invention include communications (such as wireless communications including, e.g., cellular communications, satellite communications, and deep space communications) and data storage (such as used in data storage devices, e.g., computer hard disk devices).

BACKGROUND

Error-correcting codes are used whenever communication over ag15 noisy medium (channel) takes place. Cell phones, computer hard disks, deep-space communication and many other devices communicate over a noisy medium. Error-correcting codes have been widely used and improved since 1948 as the search for optimal error correcting codes continued for decades. The basic problem in decoding is attempting to recover an original transmitted codeword from a received word that is a distorted version of the original codeword. The distortion is introduced by the noisy medium.

Polar codes were introduced in 2009. See, E. Arikan, "Channel Polarization: A method for Constructing Capacity Achieving Codes for Symmetric Binary-Input Memoryless Channels," IEEE Trans. Inform. Theory, vol. 55, pp. 3051-3073 (2009); E. Arikan and E. Telatar, "On the Rate of Channel Polarization," in Proc. IEEE Int'l Symp. Inform. Theory, Seoul, South Korea, pp. 1493-1495 (2009)

Polar codes were the first and presently remain the only family of codes known to have an explicit construction (no ensemble to pick from) and efficient encoding and decoding algorithms, while also being capacity achieving over binary input symmetric memoryless channels.). A drawback of existing polar codes to date is disappointing performance for short to moderate block lengths. Polar codes have not been widely implemented despite recognized inherent advantages over other coding schemes, such as turbo codes, because channel polarization remains slow in prior methods.

List decoding was introduced in the 1950s. See, P. Elias, "List decoding for noisy channels," Technical Report 335, Research Laboratory of Electronics, MIT (1957). List decoding addresses a worst case scenario by outputting a small number of codewords that are a small distance from the code word. List decoding has not been widely used, however. Modern applications of list decoding have sought to reduce worst-case decoding penalties. Successive cancellation list decoding has been applied in to Reed-Muller codes. See, I. Dumer and K. Shabunov, "Soft-decision Decoding of Reed-Muller codes: Recursive Lists," IEEE Trans. Inform. Theory, vol. 52, pp. 1260-1266 (2006). Reed-Muller codes are structured differently than polar codes and are widely considered in the art to have a different decoding approach. Indeed, Arikan's original paper that presented polar codes emphasized differences between polar codes and Reed-Muller codes. Phrasing of the decoding algorithms in Reed-Muller and Polar codes makes comparison difficult. The present inventors recognized that Arikan's successive cancellation decoding is similar in nature to the successive cancellation decoding of Reed-Muller codes as in Dumer-Shabnov. However, application of successive list decoding as set forth in Dumer-Shavanov would increase complexity of polar decoding to an extent that would make its application impractical. The successive cancellation list decoding in Dumer-Shabunov is also complex, and can lead to $\Omega(L \cdot n^2)$ complexity. As with prior list decoders, it will also fail to produce a single output, instead producing a small list of candidates without a single, explicit codeword.

The observation that one can reduce the space complexity of successive cancellation decoders for polar codes with hardware architectures to O(n) was noted, in the context of VLSI design, by the present inventors and colleagues in C. Leroux, I. Tal, A. Vardy, and W. J. Gross, "Hardware Architectures for Successive Cancellation Decoding of Polar Codes," rXiv:1011.2919v1 (2010). This paper does not provide a different decoding approach for polar codes, but provides architectures that can reduce the space complexity for the decoding scheme that was provided by Arikan with the introduction of polar codes.

SUMMARY OF THE INVENTION

An embodiment of the invention is a method of decoding data encoded with a polar code. A received word of polar encoded data is decoded following several distinct decoding paths to generate codeword candidates. The decoding paths are selectively successively duplicated and pruned to generate a list of potential decoding paths. A single decoding path among the list of potential decoding paths is selected as the output and a single candidate codeword is identified as the output. In another preferred embodiment, the polar encoded data includes redundancy data in its unfrozen bits. The redundancy data aids the selection of the single decoding path. A preferred device of the invention is a cellular network device, e.g., a handset that conducts decoding in according with the methods of the invention.

DETAILED DESCRIPTION OF PREFERRED EMBODIMENTS

The present inventors have recognized that drawbacks in polar codes at short to medium block lengths arises from inherent weaknesses of the code itself at these lengths or from the fact that the successive cancellation (SC) decoder employed to decode them is significantly degraded with respect to maximum likelihood (ML) decoding performance. These two possibilities are complementary, and so both may occur.

Disclosed are methods and their computer implementation that greatly improve the error-correcting performance of polar codes. Polar codes are a family of error correcting codes that facilitate the transfer of information from a transmitter to a receiver over a noisy medium (e.g., as happens in cell phones, computer hard disks, deep-space communication, etc). The invention employs a new decoding method for polar codes as well as a modification of the codes themselves. The method has been fully implemented and tested. The resulting performance is better than the current state-of-the-art in error-correction coding.

Preferred embodiments of the invention also provide a modified polar code and decoding method. In prior polar coding methods, on the transmitting end (encoding), a sequence of K information bits are mapped to a codeword of length n. In the preferred embodiment, k information bits and r CRC (cyclic redundancy check) bits together constitute the K=k+r bits mapped to a codeword of length n. These bits are denoted as $u\_1, u\_2, \ldots, u\_K$. On the receiving end (decoding), instead of first decoding $u\_1$ to either 0 or 1, then decoding $u\_2$ to either 0 or 1, and so forth, what occurs is as follows. When decoding $u\_1$, both the option of it being a 0 and the option of it being a 1 are considered. These two options are termed "paths". For each such path, both options of $u\_2$ lead to 4 paths, and so forth.

An aspect of the invention provides an improvement to the SC decoder, namely, a successive cancellation list (SCL) decoder. The list decoder has a corresponding list size L, and setting L=1 results in the classic SC decoder. While lists are used in the decoder when the algorithm executes, the decoder returns a single codeword. L is an integer parameter that can be freely chosen by a system designer. L=1 indicates the classic successive cancellation decoding (or Arikan). Higher values of L lead to better performance and higher complexity. In HI examples used to test the invention, the highest value of L is 32, but much higher values are possible extending into tens of thousands. In embodiments of the invention, L is the number of different decoding paths after pruning. After duplication, that value is 2 L. In preferred embodiments, the pruning reduces the number of paths from 2 L to L.

Embodiments of the invention also include encoders and decoders for ECC (error corrected coded) polar code communications. A preferred embodiment decoder uses a theory that duplicates data structures used by a parent path each time a decoding path spits into two forks. Each fork receives a copy. The complexity of making actual copies can grow the cost of copying quickly. To avoid this and provide reduced copying expense, namely, at each given stage, the same array may be flagged as belonging to more than one decoding path. However, when a given decoding path needs access to an array it is sharing with another path, a copy is made.

Embodiments of the invention also include polar concatenated codes executed by computer hardware and or software that aid the decoding. Instead of setting all unfrozen bits to information bits to transmit, a following concatenation is applied. For some small constant r, embodiments of the invention set the first k–r unfrozen bits to information bits. The last r unfrozen bits will hold the r-bit CRC (cyclic redundancy code) value of the first k–r unfrozen bits. This provides a reasonable penalty rate of (k–r)/n. During decoding, the concatenation provides a shortcut to refine selection. A path for which the CRC is invalid can not correspond to the transmitted codeword. Thus, the selection can be refined as follows. If at least one path has a correct CRC, then remove from the list all paths having incorrect CRC and then choose the most likely path. Otherwise, select the most likely path in the hope of reducing the number of bits in error, but with the knowledge that at least one bit is in error.

Artisans will appreciate that preferred embodiments of the invention efficiently decode polar codes by generating a list of candidate codewords with successive cancellation decoding. In preferred embodiments, a codeword is selected from the list using an outer CRC coded polar code provided by the invention.

In a preferred list decoder of the invention, up to L decoding paths are considered concurrently at each decoding stage. Simulation results show that the resulting performance is very close to that of a maximum-likelihood decoder, even for moderate values of L. The present list decoder effectively bridges the gap between successive-cancellation and maximum-likelihood decoding of polar codes. The specific list-decoding algorithm that achieves this performance doubles the number of decoding paths at each decoding step, and then uses the pruning procedure to discard all but the L best paths. The natural pruning criterion can be easily evaluated. Nevertheless, a straightforward implementation still requires $O(L\,n^2)$ time, which is in stark contrast with the $O(n \log n)$ complexity of the original successive-cancellation decoder. The structure of polar codes is used to overcome this problem and provide an efficient, numerically stable, implementation taking only $O(L\,n \log n)$ time and $O(L\,n)$ space. The polar coding strategies of the invention achieve better performance with lower complexity. In the preferred embodiment list decoder, up to L decoding paths are considered concurrently at each decoding stage. Then, a single codeword is selected from the list as output. If the most likely codeword is selected, simulation results show that the resulting performance is very close to that of a maximum-likelihood decoder, even for moderate values of L. Alternatively, if an intelligent selection procedure selects the codeword from the list, the results are comparable to the current state of the LDPC codes.

The preferred list decoder doubles the number of decoding paths at each decoding step, and then uses a pruning procedure to discard all but the L best paths. Nevertheless, a straightforward implementation still requires $O(L\cdot n)$ time, which is in stark contrast with the $O(n \log n)$ complexity of the original successive-cancellation decoder. The structure or polar codes is exploited by the invention with an efficient, numerically stable, implementation taking only O(L·n log n) time and O(L·n) space.

Those knowledgeable in the art will appreciate that embodiments of the present invention lend themselves well to practice in the form of computer program products. Accordingly, it will be appreciated that embodiments of the present invention may comprise computer program products comprising computer executable instructions stored on a non-transitory computer readable medium that, when executed, cause a computer to undertake methods according to the present invention, or a computer configured to carry out such methods. The executable instructions may comprise computer program language instructions that have been compiled into a machine-readable format. The non-transitory computer-readable medium may comprise, by way of example, a magnetic, optical, signal-based, and/or circuitry medium useful for storing data. The instructions may be downloaded entirely or in part from a networked computer. Also, it will be appreciated that the term "computer" as used herein is intended to broadly refer to any machine capable of reading and executing recorded instructions. It will also be understood that results of methods of the present invention may be displayed on one or more monitors or displays (e.g., as text, graphics, charts, code, etc.), printed on suitable media, stored in appropriate memory or storage, etc.

Preferred embodiments of the invention will now be discussed with respect to the experiments and results. Artisans will appreciate additional features of the invention from the discussion of the experimental results and example embodiments.

A preferred embodiment Successive Cancellation (SC) decoder is a modification to polar codec of Arikan. The basic decoder must first be defined to explain the modifications.

Let the polar code under consideration have length $n=2^m$ and dimension k. Thus, the number of frozen bits is n−k. The reformulation denotes by $u=(u_i)_{i=0}^{n-1}=u_0^{n-1}$ the information bits vector (including the frozen bits), and by $c=c_0^{n-1}$ the corresponding codeword, which is sent over a binary-input channel $W:\chi \to \gamma$, where $\chi=\{0, 1\}$. At the other end of the channel, the received word is $y=y_0^{n-1}$. A decoding algorithm is then applied to y, resulting in a decoded codeword $\hat{c}$ having corresponding information bits $\hat{u}$.

A. An Outline of Successive Cancellation

A high-level description of the SC decoding algorithm is provided in Algorithm I (see Algorithm section). In Algorithm I, at each phase $\phi$ of the algorithm, the pair of probabilities $W_m^\phi(y_0^{n-1},\hat{u}_0^{\phi-1}|0)$ and $W_m^\phi(y_0^{n-1},\hat{u}_0^{\phi-1}|1)$ is calculated. Then the value of $\hat{u}_\phi$ is determined according to the pair of probabilities.

Probabilities are calculated as follows. For layer $0 \leq \lambda \leq m$ $$\Lambda = 2^\lambda. \tag{1}$$

For $$0 \leq \phi < \Lambda, \tag{2}$$

bit channel $W_\lambda^\phi$ is a binary input channel with output alphabet $\gamma^\Lambda \times \chi^\phi$, the conditional probability of which is generically denoted $$W_\lambda^\phi(y_0^{\Lambda-1},u_0^{\phi-1}|u_\phi). \tag{3}$$

In the present context, $y_0^{\Lambda-1}$ is always a contiguous subvector of received vector y. Next, for $1 \leq \lambda \leq m$. recall the recursive definition of a bit channel (Provided in Equations (22) and (23) of E. Arikan, "Channel Polarization: A method for Constructing Capacity Achieving Codes for Symmetric Binary-Input Memoryless Channels," IEEE Trans. Inform. Theory, vol. 55, pp. 3051-3073 (2009): let $0 \leq 2\psi < \Lambda$, then $$W_\lambda^{(2\psi)}(y_0^{\Lambda-1}, u_0^{2\psi-1} | u_{2\psi}) = \sum_{u_{2\psi+1}} \frac{1}{2} \underbrace{W_{\lambda-1}^{(\psi)}(y_0^{\Lambda/2-1}, u_{0,even}^{2\psi-1} \oplus u_{0,odd}^{2\psi-1} | u_{2\psi} \oplus u_{2\psi+1})}_{\text{branch } 2\beta} \cdot \underbrace{W_{\lambda-1}^{(\psi)}(y_{\Lambda/2}^{\Lambda-1}, u_{0,odd}^{2\psi-1} | u_{2\psi+1})}_{\text{branch } 2\beta+1} \tag{4}$$

and $$\underbrace{W_\lambda^{(2\psi+1)}(y_0^{\Lambda-1}, u_0^{2\psi} | u_{2\psi+1})}_{\text{branch } \beta} = \frac{1}{2} \underbrace{W_{\lambda-1}^{(\psi)}(y_0^{\Lambda/2-1}, u_{0,even}^{2\psi-1} \oplus u_{0,odd}^{2\psi-1} | u_{2\psi} \oplus u_{2\psi+1})}_{\text{branch } 2\beta} \cdot \underbrace{W_{\lambda-1}^{(\psi)}(y_{\Lambda/2}^{\Lambda-1}, u_{0,odd}^{2\psi-1} | u_{2\psi+1})}_{\text{branch } 2\beta+1} \tag{5}$$

with "stopping condition" $W_0^{(0)}(y|u)=W(y|u)$.

For algorithm 1 to become concrete, it is necessary to specify how the probability pair associated with $W_m^\phi$ is calculated, and how the values of $\hat{u}$, namely $\hat{u}_0^{\phi-1}$, are propagated into those calculations. For $\lambda>0$ and $0 \leq \phi < \Lambda$, recall the recursive definition of $W_\lambda^\phi(y_0^{\Lambda-1},u_0^{\phi-1}|u_\phi)$ given in either (4) or (5), depending on the parity of $\phi$. For either $\phi=2\psi$ or $\phi=2\psi+1$, the channel $W_{\lambda-1}^\phi$ is evaluated with output $(y_{\Lambda/2}^{\Lambda-1},u_{0,even}^{2\psi-1} \oplus u_{0,odd}^{2\psi-1})$ as wall as with output $(y_{\Lambda/2}^{\Lambda-1},u_{0,odd}^{2\psi-1})$. Preferred embodiments utilize these recursions. The output can be defined simply to aid the analysis. This can be accomplished by specifying, apart from the layer $\lambda$ and the phase $\phi$ which define the channel, the branch number $$0 \leq \beta < 2^{m-\lambda} \tag{6}$$

Since, during the run of the SC algorithm, the channel $W_m^\phi$ is only evaluated with a single output $(y_0^{\Lambda-1},u_0^{\phi-1}|u_\phi)$ and corresponding branch number $\beta=0$ is assigned to each output. Next, proceed recursively as follows. For $\lambda>0$, consider a channel $W_\lambda^\phi$, with output $(y_0^{\Lambda-1},u_0^{\phi-1})$ a branch number $\beta=0$ is assigned to each such output. Next proceed recursively as follows. For $\lambda>0$, consider a channel $W_\lambda^\phi$ with output $(y_0^{\Lambda-1},u_0^{\phi-1})$ and corresponding branch number $\beta$. Denote $\psi=\lfloor \phi/2 \rfloor$. The output $(y_{\Lambda/2}^{\Lambda-1},u_{0,even}^{2\psi-1} \oplus u_{0,odd}^{2\psi-1})$ will have a branch number of $2\beta+1$. An output corresponding to branch $\beta$ of a channel is introduced.

Embodiments of an invention define and use a first data structure. For each layer $0 \leq \lambda \leq m$, a probabilities array is denoted by $P_\lambda$, indexed by an integer $0 \leq i < 2^m$ and a bit $b \in \{0, 1\}$. For a given layer $\lambda$, an index i will correspond to a phase $0 \leq \phi < \Lambda$ and a branch $0 \leq \beta < 2^{m-\lambda}$ using the following quotient/reminder representation.

$$i = \langle \phi, \beta \rangle_\lambda = \phi + 2^\lambda \cdot \beta \tag{7}$$

To avoid repetition, the following shorthand is adopted $$P_\lambda[\langle \phi, \beta \rangle] = P_\lambda[\langle \phi, \beta \rangle_\lambda] \tag{8}$$

The probabilities array data structure $P_\lambda$ is used as follows. Let layer $0 \leq \lambda < m$, phase $0 \leq \phi < \Lambda$, and branch $0 \leq \beta < 2^{m-\lambda}$ be given. Denote the output corresponding to branch $\beta$ of $W_\lambda^\phi$ as $(y_0^{\Lambda-1},u_0^{\phi-1})$. Then ultimately, both values of b are obtained that $$P_\lambda[\langle \phi, \beta \rangle][b] = W_\lambda^\phi(y_0^{\Lambda-1},u_0^{\phi-1}|b) \tag{9}$$

The input corresponding to a branch can be defined via a similar terminology. Start at layer m and continue recursively. Consider the channel $W_m^\Phi$, and let $\hat{u}_\phi$ be the corresponding input which Algorithm 1 assumes. This input is assigned a branch number $\beta=0$. Proceed recursively as follows. For layer $\lambda>0$, consider the channels $W_\lambda^{2\psi}$ and $W_\lambda^{2\psi+1}$ having the same branch $\beta$ with corresponding inputs $u_{2\psi}$ and $u_{2\psi}+1$, respectively. In view of (5) consider $W_{\lambda-1}^{\psi}$ and define the input corresponding to branch $2\beta$ as $u_{2\psi} \oplus u_{2\psi}+1$. Under this recursive definition, for all $0 \leq \lambda < m$, $0 \leq \phi < \Lambda$, and $0 \leq \beta < 2^{m-\lambda}$, and input corresponding to branch $\beta$ of $W_\lambda^\phi$ is well defined.

The following lemma points at the natural meaning that a branch number has at layer $\lambda=0$. This can be proved using a straightforward induction.

Lemma 1: Let y and ĉ be as in Algorithm 1, the received vector and the decoded codeword. Consider layer $\lambda=0$ and thus set $\phi=0$. Next, fix a branch number $0 \leq \beta < 2^n$. Then, the input and output corresponding to branch $\beta$ of $W_0^{(0)}$ are $y_\beta$ and $\hat{c}_\beta$ respectively.

A second data structure is now introduced. For each layer $0 \leq \lambda < m$, a bit array, is denoted by $B_\lambda$, and indexed by an integer $0 \leq i < 2^m$, as in (7). The data structure can be used as follows. Let layer $0 \leq \lambda < m$, phase $0 \leq \phi < \Lambda$, and branch $\beta$ of $W_\lambda^\phi$ as $u(\lambda, \phi, \beta)$. Then ultimately, $$B_\lambda[\langle \phi, \beta \rangle] = \hat{u}(\lambda, \phi, \beta), \quad (10)$$

which adopts the same shorthand as (8). The total memory consumed by this algorithm is O(n log n). A preferred first implementation of the SC decoder is given as Algorithms 2-4 (see Algorithm Section). The main loop is given in Algorithm 2, and follows the high-level description given in Algorithm 1. Note that the elements of the probabilities arrays $P_\lambda$ and bit array $B_\lambda$, start-out uninitialized, and become initialized as the algorithm runs its course. The code to initialize the array values is given in Algorithms 3 and 4.

Lemma 2: Algorithms 2-4 are a valid implementation of the SC decoder.

Proof: In addition to proving the claim explicitly stated in the lemma, the implicit claim can also be proven. Namely, the actions taken by the algorithm should be shown to be well defined. This could be shown by demonstrating that when an array element is read from, it was already written to (it is initialized).

Both the implicit and the explicit claims are easily derived from the following observation. For a given $0 \leq \phi < n$, consider iteration $\phi$ of the main loop in Algorithm 2. Fix a layer $0 \leq \lambda < m$, and a branch $0 \leq \beta < 2^{m-\lambda}$. If a run of the algorithm is suspended just after the iteration ends, then (9) hold up with $\acute{\phi}$ instead of $\phi$, for all $$0 \leq \acute{\varphi} \leq \left\lfloor \frac{\varphi}{2^{m-\lambda}} \right\rfloor$$

Similarly, (10) holds with all $\acute{\phi}$ instead of $\phi$ for all $$0 \leq \acute{\varphi} < \left\lfloor \frac{\varphi+1}{2^{m-\lambda}} \right\rfloor$$

The above observation is proved by induction on $\phi$.

The running time of the known SC decoder is O(n log n) and the implementation provided above is no exception. The space complexity of the present algorithm is O(n log n) as well. However, in the above observation the space complexity can be reduced to O(n).

As a first step towards this end, consider the probability pair array $P_m$. By examining the main loop in Algorithm 2, it is seen that when it is currently at phase $\phi$, then it will never again make of use $P_m[\langle \phi', 0 \rangle]$, for all $\phi' < \phi$. On the other hand, $P_m[\langle \phi'', 0 \rangle]$ is uninitialized for all $\phi'' > \phi$. Thus, instead of reading and writing to $P_m\langle \phi, 0 \rangle]$, it is possible to essentially disregard the phase information, and use only the first element $P_m[0]$ of the array, discarding all the rest. By the recursive nature of the polar codes, this observation—disregarding the phase information—can be exploited for a general layer $\lambda$ as well. Specifically, for all $0 \leq \lambda < m$, it is now possible t define the number of elements in $P_\lambda$ to be $2^{m-\lambda}$.

Accordingly, $$P_\lambda[\langle \phi, \beta \rangle] \text{ is replaced by } P_\lambda[\langle \beta \rangle]. \quad (11)$$

Note that the total space needed to hold the P arrays has gone down from O(n log n) to O(n). That is also desirable for the B arrays. However, the above implementation does not permit the phase to be disregarded, as can be seen, for example, in line 3 of Algorithm 4. The solution is a simple renaming. As a first step, define for each $0 \leq \lambda \leq m$ an array $C_\lambda$ consisting of bit pairs and have length n/2. Next, let a generic reference of the form $B_\lambda[\langle \phi, \beta \rangle]$ be replaced by $C_\lambda[\psi+\beta \cdot 2^{\lambda-1}][\phi \mod 2]$, where $\psi=\lfloor \phi/2 \rfloor$. This renames the elements of $B_\lambda$ as elements of $C_\lambda$. It is now possible to disregard the value of $\psi$ and take note only of the parity of $\phi$. With one more substitution: replace every instance of $C_\lambda[\psi+\beta \cdot 2^{\lambda-1}][\phi \mod 2]$ by $C_\lambda[\beta][\phi \mod 2]$, and resize each array with $C_\lambda$ to have $2^{m-\lambda}$ bit pairs. To sum up, $$B_\lambda[\langle \phi, \beta \rangle] \text{ is replaced by } C_\lambda[\beta][\phi \mod 2]. \quad (12)$$

A further reduction in space is possible: for $\lambda=0$, $\phi=0$, and thus the parity of $\phi$ is always even. However, this reduction does not affect the asymptotic space complexity which is now indeed down to O(n). The revised algorithm is given as Algorithms 5-7.

The above statements are also of use in analyzing the time complexity of the preferred embodiment list decoder.

Figure 4:
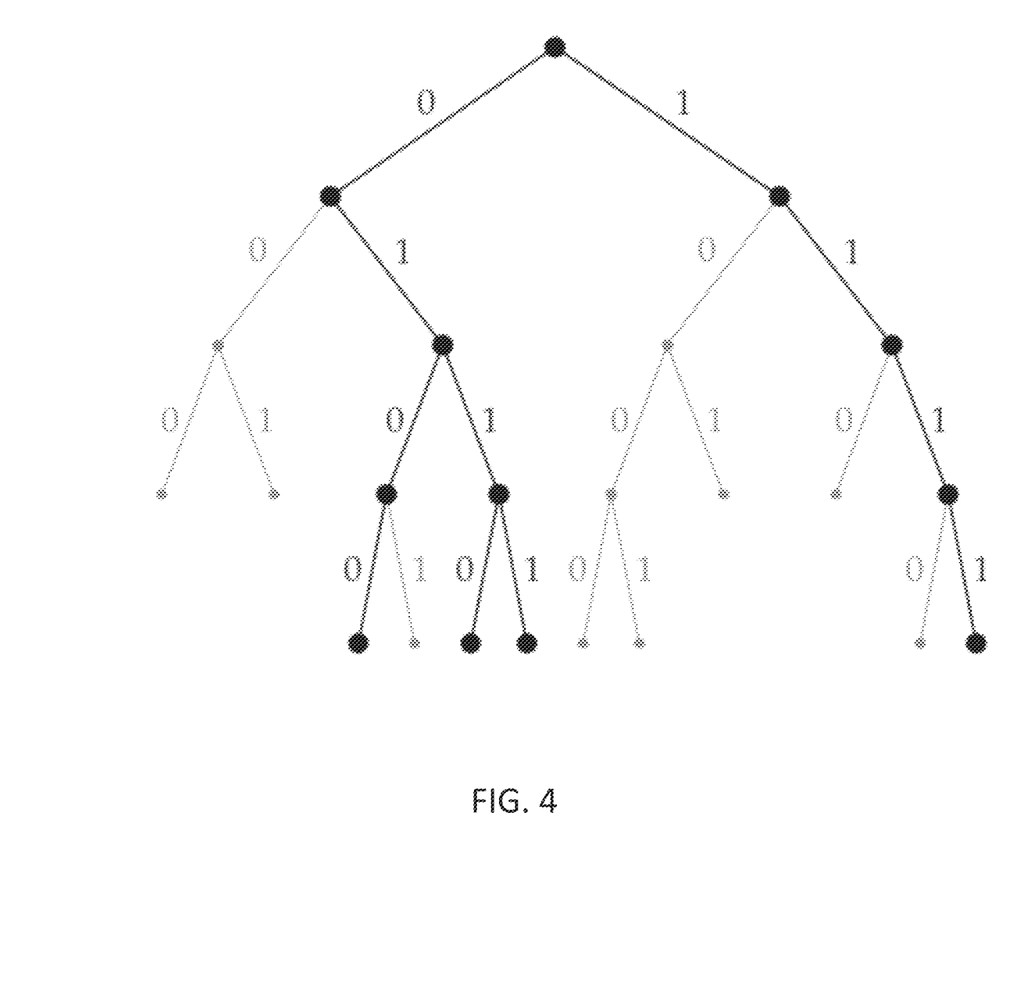
FIG. 4 shows decoding paths in accordance with the invention of unfrozen bits for L=4: with each level has at most 4 nodes with paths that continue downward and discontinued paths being grayed out.

A preferred embodiment is referred to as a successive cancellation list (SCL) decoder, and example decoding is shown in FIG. 4. The list decoder has a parameter L, called the list size. Generally speaking, larger values of L mean lower error rates but longer running times. In the main loop of an SC decoder, each phase provides a decision on the value of $\hat{u}_\phi$. In the present SCL decoder, instead of deciding to set the value of an unfrozen $\hat{u}_\phi$ to either a 0 or a 1, the decoding path splits into two paths (see FIG. 4) to be examined. Paths must be pruned to limit the maximum number of paths allowed to the specified list size, L. A pruning criterion is provided to keep the most likely paths at each stage. A simple implementation of the pruning can proceed as follows. Each time a decoding path is split into two forks, the data structures used by the "parent" path are duplicated, with one copy given to the first fork and other to the second. Since the number of splits is $\Omega(L \cdot n)$, and since the size of the data structures used by each path is $\Omega(n)$, the copying operation alone would consume time $\Omega(L \cdot n^2)$. This running time is only practical for short codes. However, all known (to the present inventors) implementations of successive cancellation list have complexity at least $(L \cdot n^2)$. Preferred embodiments of SCL decoding reduces time complexity to O(L·n log n) instead of $\Omega(L \cdot n^2)$.

Consider the P arrays of and recall that the size of $P_\lambda$ is proportional to $2^{m-\lambda}$. Thus, the cost of copying $P_\lambda$ grows exponentially small with $\lambda$. On the other hand, looking at the main loop of Algorithm 5 and unwinding the recursion, $P_\lambda$ is accessed only every $2^{m-\lambda}$ increments of $\phi$. The bigger $P_\lambda$ is, the less frequently it is accessed. The same observation applies to the C arrays. This observation of the present inventors leads to the use of a "lazy-copy" operation in preferred embodiments. Namely, at each given stage, the same array may be flagged as belonging to more than one decoding path. However, when a given decoding path needs access to an array it is sharing with another path, a copy is made.

Low-level functions and data structures can provide the "lazy-copy" methodology. The formulation is kept simple for purposes of explanation, but artisan will recognize some clear optimizations. The following data structures are defined and initialized in Algorithm 8.

Each path with have an index l, where $0 \leq l < L$. At first, only one path will be active. As the algorithm runs its course, paths will change states between "active" and "inactive" The inactivePathIndices stack (See, Section 10.1 of T. H. Cormen, C. E. Leiserson, R. L. Rivest, and C. Stein, "Introduction to Algorithms, 2nd ed. Cambridge, Mass.: The MIT Press (2001)) will hold the indices of the inactive paths. This assumes the "array" implementation of a stack, in which both "push" and "pop" operations take O(1) time and a stack of capacity L takes O(L) space. The activePath array is a Boolean array such that activePath[l] is true if path l is active. Note that, essentially, both inactivePathIndices and activePath store the same information. The utility of this redundancy will be made clear shortly.

For every layer $\lambda$, there will be a "bank" of L probability-pair arrays for use by the active paths. At any given moment, some these arrays might be used by several paths, while others might not be used by any path. Each such array is pointed by an element of arrayPointer_P. Likewise, there will be a bank of bit-pair arrays, pointed to by elements of arrayPointer_C.

The pathIndexToArrayIndex array is used as follows. For a given layer $\lambda$ and path index l, the probability-pair array and bit-pair array corresponding to layer $\lambda$ of path l are pointed to by arrayPointer_P[$\lambda$][pathIndexToArrayIndex[$\lambda$][l]]

and arrayPointer_C[$\lambda$][pathIndexToArrayIndex[$\lambda$][l]], respectively.

At any given moment, some probability-pair and bit-pair arrays from the bank might be used to multiple paths, while others may not be used by any. The value of arrayReferenceCount[$\lambda$][s] denotes the number of paths currently using the array pointed to by arrayPointer_P[$\lambda$][s]. This is also the number of paths making use of arrayPointer_C[$\lambda$][s]. The index s is contained in the stack inactiveARrayIndieces[$\lambda$] if arrayReferenceCount[$\lambda$][s] is zero.

With the data structures initialized, the low-level functions by which paths are made active and inactive can be stated. Start by reference to Algorithm 9, by which the initial path of the algorithm is assigned and allocated. This serves to choose a path index l that is not currently in use (none of them are), and mark it as used. Then, for each layer $\lambda$, mark (through pathIndexToArrayIndex) an index s such that both arrayPointer_P[$\lambda$][s] and arrayPointer_C[$\lambda$][s] are allocated to the current path.

Algorithm 10 is used to clone a path—the final step before splitting that path in two. The logic is very similar to that of Algorithm 9, but now the two paths are made to share bit-arrays and probability arrays.

Algorithm 11 is used to terminate a path, which is achieved by marking it as inactive. After this is done, the arrays marked as associated with the path are considered. Since the path is inactive, it is treated as not having any associated arrays, and thus all the arrays that were previously associated with the path can have their reference count decreased by one.

The goal of all previously discussed low-level functions was essential to enable the abstraction implemented by the functions getArrayPointer_P and getArrayPointer_C. The function getArrayPointer_P is called each time a higher-level function needs to access (either for reading or writing) the probability-pair array associated with a certain path l and layer $\lambda$. The implementation of getArrayPointer_P is provided in Algorithm 12. There are two cases to consider: either the array is associated with more than one path or it is not. If it is not, then nothing needs to be done, and a pointer can be returned to the array. On the other hand, if he array is shared a private copy is created for path l, and a pointer is returned to that copy. This ensures that two paths will never write to the same array. The function getArrayPointer_C is used in the same manner for bit-pair arrays, and has exactly the same essential implementation.

The above implementation deliberately sacrifices speed for simplicity. Namely, each such function is called either before reading or writing to an array. A variation to optimize speed conducts the copy operation only before writing.

This completes the definition of almost all low-level functions. Constraints that should be followed and what is expected if these constraints are met are provided next.

Definition 1 (Valid calling sequence): Consider a sequence $(f_t)_{t=0}^T$ of T+1 calls to the low-level functions implemented in Algorithms 8-12. The sequence is considered valid if the following traits hold.

Initialized: The one and only index t for which $f_t$ is equal to intializedDataStructures is t=0. The one and only index t for which $f_t$ is equal to assignIntialPath is t=1.

Balanced: For $1 \leq t \leq T$, denote the number of times the function clonePath was called up to and including t as $\#_{clonePath}^{(t)} = |\{1 \leq i \leq t : f_i \text{ is clonePath}\}|.$ Define $\#_{killPath}^{(t)}$ similarly. Then for every $1 \leq t \leq L$, the algorithm requires that $$1 \leq (1 + \#_{clonePath}^{(t)} - \#_{killpath}^{t}) \leq L. \quad (13)$$

Active: A path l is active at the end of stage $1 \leq t \leq T$ if the following conditions hold. First, there exists an index $1 \leq i \leq t$ for which $f_i$ is either clonePath with corresponding output l or assignIntialPath with output l. Second, there is no intermediate index $i < j \leq t$ for which $f_j$ is killPath with input l. For each $1 \leq t \leq T$ we require that $f_{t+1}$ has input l, then l is active at the end of stage t.

Lemma 3: Let $(f_t)_{t=0}^T$ be a valid sequence of calls to the low-level function implemented in Algorithms 8-12. Then, the run is well defined: i) A "pop" operation is never carried out on an empty stack, ii) a "push" operation never results in a stack with more than L elements, and iii) a "read" operation from any array defined in lines 2-7 of Algorithm 8 is always preceded by a "write" operation to the same location in the array.

Proof: The proof reduces to proving the following four statements concurrently for the end of each step $1 \leq t \leq T$, by induction on t.

I A path index l is active by Definition 1 if activePath[l] is true if inactivePathIndices does not contail the index 1.

II The bracketed expression in (13) is the number of active paths at the end of stage t.

III The value of arrayReferenceCount[λ][s] is positive if the stack inactiveArrayIndices[λ] does not contain the index s, and is zero otherwise.

IV The value of arrayReferenceCount[λ][s] is equal to the number of active paths l for which pathIndexArrayIndex[λ][l]=s.

Before completing formalization of the utility of the low-level functions, the concept of a descendant path needs to be specified. Let $(f_t)_{t=0}^T$ be a valid sequence of calls. Next let l be an active path index at the end of stage s≤t≤T. Henceforth, abbreviate the phrase "path index l at the end of stage t" by "[l,t]". [l',t+1] is a child of "[l,t] if i) l' is active at the end of stage t+1, and ii) either l'=l or $f_{t+1}$ was the clonePath operation with input l and output l'. Likewise, [l',t'] is a descendant of [l,t] if 1≤t≤,t'] and there is a (possibly empty) hereditary chain.

The definition of a valid function calling sequence can now be broadened by allowing reads and writes to arrays.

Fresh pointer: consider the case where t>1 and $f_t$ is either the getArrayPointer_P or getArrayPointer_C function with input (λ,l) and output p. Then, for valid indices I, allow read and write operations to p[i] after stage t but only before ant stage t'>t for which $f_{t'}$ is either clonePath or killPath.

Informally, the following lemma states that each path effectively sees a private set of arrays.

Lemma 4: Let $(f_t)_{t=0}^T$ be a valid sequence of calls to the low-level functions implemented in Algorithms 8-12. Assume the read/write operations between stages satisfy the "fresh pointer" condition.

Let the function $f_t$ be getArrayPointer_P with input (λ,l') and output p. Similarly, for stage t'>t, let $f_{t'}$ be getArrayPointer_P with input (λ,l') and output p'. Assume that [l',t'] is a descendant of [l,t].

Consider a "fresh pointer" write operation to p[i]. Similarly, consider a "fresh pointer" read operation from p'[i] carried out after the "write" operation. Then assuming no intermediate "write" operations of the above nature, the value written is the value read.

A similar claim holds for getArrayPointer_C.

Proof: With the observations made in the proof Lemma 3 at hand, a simple induction on t is all that is needed.

The function pathIndexInactive given in Algorithm 13 is simply a shorthand, meant to help readability.

B. Mid-Level Functions

Algorithms 14 and 15 are modified implementations of Algorithms 6 and 7, respectively, for the list decoding setting.

These implementations of the preferred embodiment loop over all the path indices l. Thus, the implementations make use of the functions getArrayPointer_P and getArrayPointer_C in order to assure that the consistency of calculations is preserved, despite multiple paths sharing information. In addition, Algorithm 6 contains code to normalize probabilities. The normalization retained for a technical reason (to avoid floating-point underflow), and will be expanded on shortly.

Note that the "fresh pointer" condition imposed indeed holds. To see this, consider first Algorithm 14. The key point to note is that neither the killPath nor the clonePath function is called from inside the algorithm. The same observation holds for Algorithm 15. Thus the "fresh pointer" condition is met, and Lemma 4 holds.

Consider next the normalization step carried out in lines 21-27 of Algorithm 14. Recall that a floating-point variable cannot be used to hold arbitrarily small positive reals, and in a typical implementation, the result of a calculation that is "too small" will be rounded to 0. This scenario is called an "underflow".

Previous implementations of SC decoders were prone to "underflow". To see this, consider line 1 in the outline implementation given in Algorithm 2. Denote by Y and U the random vectors corresponding to y and u, respectively. For ε ∈ {0,1}, $$W_m^{(\phi)}(y_0^{n-1}, \hat{u}_0^{\phi-1}|b) = 2 \cdot \mathbb{P}(Y_0^{n-1} = y_0^{n-1}, U_0^{\phi-1} = \hat{u}_0^{\phi-1}, U_\phi = b) \leq 2 \cdot \mathbb{P}(U_0^{\phi-1} = \hat{u}_0^{\phi-1}, U_\phi = b) = 2^{-\phi}.$$

Recall that φ iterates from 0 to n−1. Thus, for codes having length greater than some small constant, the comparison in line 1 of Algorithm 2 ultimately becomes meaningless, since both probabilities are rounded to 0.

Preferred embodiments provide a fix to this problem. After the probabilities are calculated in lines 5-20 of Algorithm 14, normalize the highest probability to be 1 in lines 21-27. The correction does not guarantee in all circumstances that underflows will not occur. However, the probability of a meaningless comparison due to underflow will be extremely low.

Apart from minimizing risk of overflows, normalization does not alter the algorithm. The following lemma formalizes this claim.

Lemma 5: Assume "perfect" floating-point numbers. That is, floating-point variables are infinitely accurate and do not suffer from underflow/overflow. Next, consider a variant of Algorithm 14, termed Algorithm 14', in which just before line 21 is first executed, the variable σ is set to 1. That is effectively, there is no normalization of probabilities in Algorithm 14'.

Consider two runs, one of Algorithm 14 and one of Algorithm 14'. In both runs, the input parameters to both algorithms are the same. Moreover, assume that in both runs, the state of the auxiliary data structures is the same, apart from the following.

Recall that the present algorithm is recursive, and let $\lambda_0$ be the first value of the variable λ for which line 5 is executed. That is, $\lambda_0$ is the layer in which (both) algorithms do not perform preliminary recursive calculations. Assume at this base stage λ=$\lambda_0$, the following holds: the values read from $P_{\lambda-1}$ in lines 15 and 20 in the run of Algorithm 14 are a multiple by $\alpha_{\lambda-1}$ of the corresponding values read in the run of Algorithm 14'. Then, for every λ≥$\lambda_0$, there exists a constant $\alpha_\lambda$ such that values written to $P_\lambda$ in line 27 in the run of Algorithm 14 are a multiple by $\alpha_\lambda$ of the corresponding values written by Algorithm 14'.

Proof: For the base case λ=$\lambda_0$ inspections shows that the constant $\alpha_\lambda$ is simply $(\alpha_{\lambda-1})^2$, divided by the value of σ after the main loop has finished executing in Algorithm 14. The claim for a general λ follows by induction.

C. High-Level Functions

Consider the topmost function, the main loop given in algorithm 16. Line 1 and 2, provide that the condition "initialized" in Definition 1 is satisfied. Also, for the inductive basis, the condition "balanced" holds that for t=1 at the the end of line 2. Next, notice that lines 3-5 are in accordance with the "fresh pointer" condition.

The main loop, lines 6-13, is the analog of the main loop in Algorithm 5. After the main loop has finished, the algorithm selects (in lines 14-16) the most likely codeword from the list and returns it.

Algorithms 17 and 18 are now introduced. Algorithm 17 is the analog of line 6 in Algorithm 5, applied to active paths.

Algorithm 18 is the analog of lines 8-11 in Algorithm 5. However, now, instead of choosing the most likely fork out of 2 possible forks, it is typical to need to choose the L most likely forks out of 2 L possible forks. The most interesting line is 14, in which the best ρ forks are marked. Surprisingly, this can be done in O(L) time (See, Section 9.3 of T. H. Cormen, et al., "Introduction to Algorithms, 2nd ed. Cambridge, Mass.: The MIT Press (2001)). The O(L) time result rather theoretical. Since L is typically a small number, the fastest way to achieve the selection goal would be through simple sorting. After the forks are marked, first kill the path for which both forks are discontinued, and then continue paths for which one or both are the forks are marked. In case of the latter, the path is first split. The procedure first kills paths and only then splits paths in order for the "balanced" constraint (13) to hold. This provides a limit of L active paths at a time.

A primary function of Algorithm 18 is to prune the list and leave only the L "best" paths. This pruning is performed using the accumulated likelihood of each path. The accumulated likelihood is stored in the "probForks" array of Algorithm 18. The selection of the L "best" paths is conducted on line 14 of Algorithm 18. Selection of the L "best" paths is indeed achieved, in the following sense. At stage φ to rank each patch according to the probability $$W_m^{\phi}(y_0^{n-1}, \hat{u}_0^{\phi-1} | \hat{u}_\phi).$$

By (9) and (11), this would indeed by the if the floating point variables were "perfect", and the normalization step in lines 21-27 of Algorithm 14 were not carried out. By Lemma 5 this is still the case if normalization is carried out.

In Algorithm 19, the most probable path is selected from the final list. As before, by (9)-(12) and Lemma 5, the value of $P_m[0][C_m[0][1]]$ is simply $$W_m^{(n-1)}(y_0^{n-1}, \hat{u}_0^{n-2} | \hat{u}_{n-1}) = \frac{1}{2^{n-1}} \cdot P(y_0^{n-1} | \hat{u}_0^{n-1}),$$

up to normalization constant.

A proof of space and time complexity follows.

Theorem 6: The space complexity of the SCL decoder is O(L·n).

Proof: All the data structures of the list decoder are allocated by in Algorithm 8, and it can be checked that the total space used by them is O(L·n). Apart from these, the space complexity needed in order to perform the selection operation in line 14 of Algorithm 18 is O(L). Lastly, the various local variables needed by the algorithm take O(1) space, and the stack needed in order to implement the recursion takes O(log n) space.

Theorem 7: the running time of the SCL decoder is O(L·n log n).0

Proof: Recall that m=log n. The following bottom-to-top table summarizes the running time of each function. The notation $O_\Sigma$ will be explained after.

| function | running time |
|---|---|
| initializeDataStructures( ) | O(L · m) |
| assignInitialPath( ) | O(m) |
| clonePath(l) | O(m) |
| killPath(l) | O(m) |
| getArrayPointer_P(λ, l) | $O(2^{m-\lambda})$ |
| getArrayPointer_C(λ, l) | $O(2^{m-\lambda})$ |
| pathIndexInactive(l) | O(1) |
| recursivelyCalcP(m, ·) | $O_\Sigma(L \cdot m \cdot n)$ |
| recursivelyUpdateC(m, ·) | $O_\Sigma(L \cdot m \cdot n)$ |
| continuePaths_FrozenBit(φ) | O(L) |
| continuePaths_FrozenBit(φ) | O(L · m) |
| findMostProbablePath | O(L) |
| SCL decoder | O(L · m · n) |

The first 7 functions in the table, the low-level functions, are easily checked to have the stated running time. Note that the running time of getArrayPointer_P and getArrayPointer_C is due to the copy operation in line 6 of Algorithm 6 applied to an array of size $O(2^{m-\lambda})$. Thus, as we previously mentioned, reducing the size of the arrays has helped to reduce the running time of the list decoding algorithm.

Next, consider the two mid-level functions, namely, recursivelyCalcP and recursivelyUpdateC. The notation $$\text{recursivelyCalcP}(m, \cdot) \in O_\Sigma(L \cdot m \cdot n)$$

means that total running time of the n function calls $$\text{recursivelyCalcP}(m, \phi), 0 \le \phi < 2^l$$

is O(L·m·n). To see this, denote by f(λ) the total running time of the above with m replaced by λ. By splitting the running time of Algorithm 14 into a non-recursive part and a recursive part for λ>0

$$f(\lambda) = 2^\lambda \cdot O(L \cdot 2^{m-\lambda}) + f(\lambda - 1).$$

Thus, it follows that $$f(m) \in O(L \cdot m \cdot 2^m) = O(L \cdot m \cdot n).$$

In essentially the same way it can be proven that the total running time of the recursivelyUpdateC(m, φ) over all $2^{n-1}$ valid (odd) values of φ is O(m·n). Note that the two mid-level functions are invoked in lines 7 and 13 of Algorithm 16, on all valid inputs.

The running time of the high-level functions is easily checked to agree with the table.

Modified Polar Codes

Figure 5A:
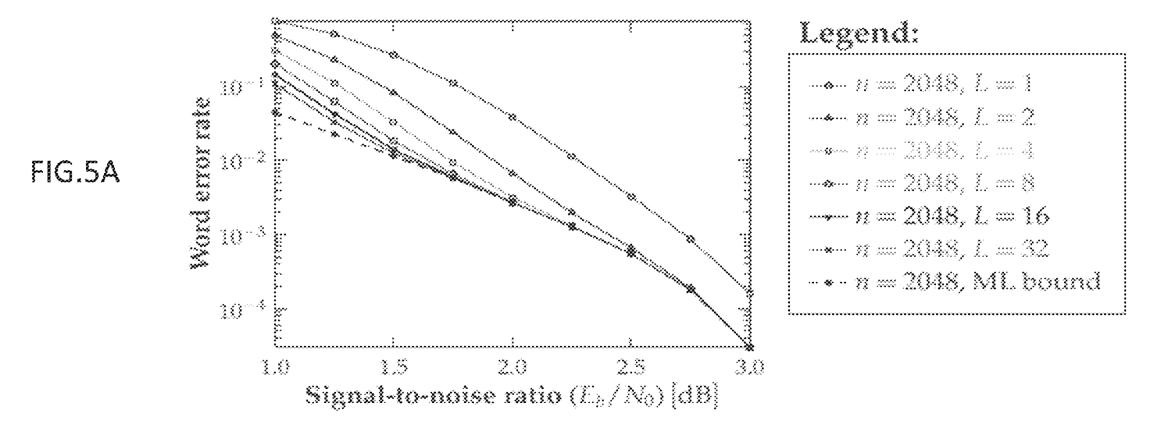
FIGS. 5A and 5B show word error rate of length n=2048 (FIG. 5A) and n=8192 (FIG. 5B) rate ½ polar code in accordance with the present information optimized for SNR=2 dB under various list sizes; and the code construction was carried out as in FIG. 1.
Figure 5B:
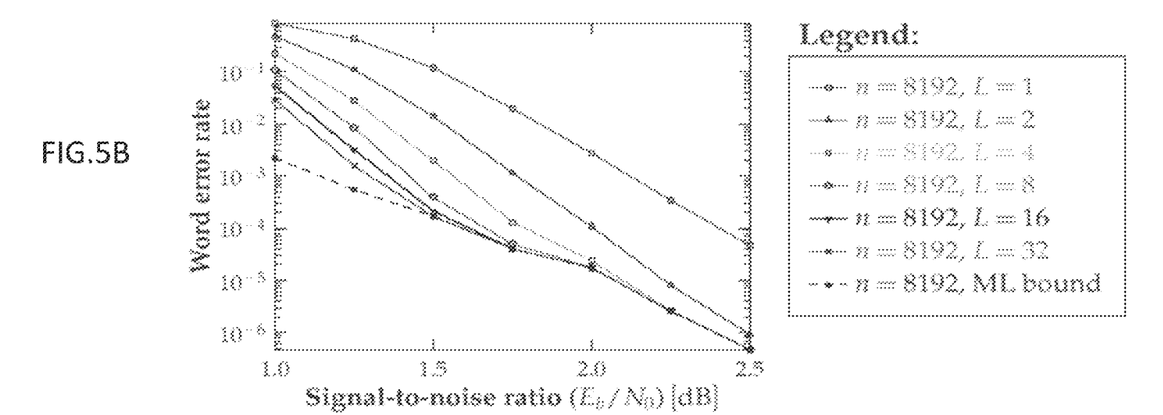

The plots in FIGS. 5A and 5B were obtained by simulation. The performance of the decoder for various list sizes is given by the solid lines in the figure. As expected, as the list size L increases, the performance of the decoder improves.

A diminishing-returns phenomenon is noticeable in terms of increasing list size. The reason for this turns out to be simple.

The dashed line, termed the "ML bound" was obtained as follows. During simulations for L=32, each time a decoding failure occurred, a check was conducted to see whether the decoded codeword was more likely than the transmitted codeword. That is true whether W(y|ĉ)>W(y|c). If so, then the optimal ML decoder would surely misdecode y as well. The dashed line records the frequency of the above event, and is thus a lower-bound on the error probability of the ML decoder. Thus, for an SNR value greater than about 1.5 dB, FIG. 1 suggests an essentially optimal decoder is provided when L=32.

Better performance seems unlikely at least for the region in which the decoder is essentially optimal. However, a modified polar code of a preferred embodiment dramatically improved performance can be achieved.

During simulations, when a decoding error occurred, the path corresponding to the transmitted codeword was often a member of the final list. However, since there was a more likely path in the list, the codeword corresponding tot that path was returned, which resulted in a decoding error. Thus, intelligent selection at the final stage can specify which path to pick from the list, then the performance of the decoder can be improved.

Such intelligent selection can be implemented with preferred embodiments that provide a modified polar code. Recall that there are k unfrozen bits that are free to be set. Instead of setting all of them to information bits to be transmitted, a concatenation scheme is employed. For some small constant r, set the first k−r unfrozen bits to information bits. The last r bits will hold the r-bit CRC (See Section8.8 of W. W. Peterson and E. J. Weldon, Error-Correcting Codes, 2nd ed. Cambridge, Mass.: The MIT Press, 1972) value of the first k−r unfrozen bits. A binary linear code having a corresponding k×r parity-check matrix constructed as follows will perform well. Le the first k−r columns be chosen at random and the last r columns be equal to the identity matrix. This concantated encoding is a variation of the polar coding scheme that provides an important functionality for intelligent selection, while being minor from the perspective of the polar code structure. The concentration incurs a penalty in rate, since the rate of the code is now (k−r)/n instead of the previous k/n.

What is gained is an approximation to a perfect selector at the final stage of decoding, instead of calling the function findMostProbablePath in Algorithm 19, do the following. A path for which the CRC is invalid can not correspond to the transmitted codeword. Thus, refine the selection as follows. If at least one path has a correct CRC, then remove from the list all paths having incorrect CRC, and then choose the most likely path. Otherwise, select the most likely path in the hope of reducing the number of bits in error, but with the knowledge that there is at least one bit in error.

Figure 1:
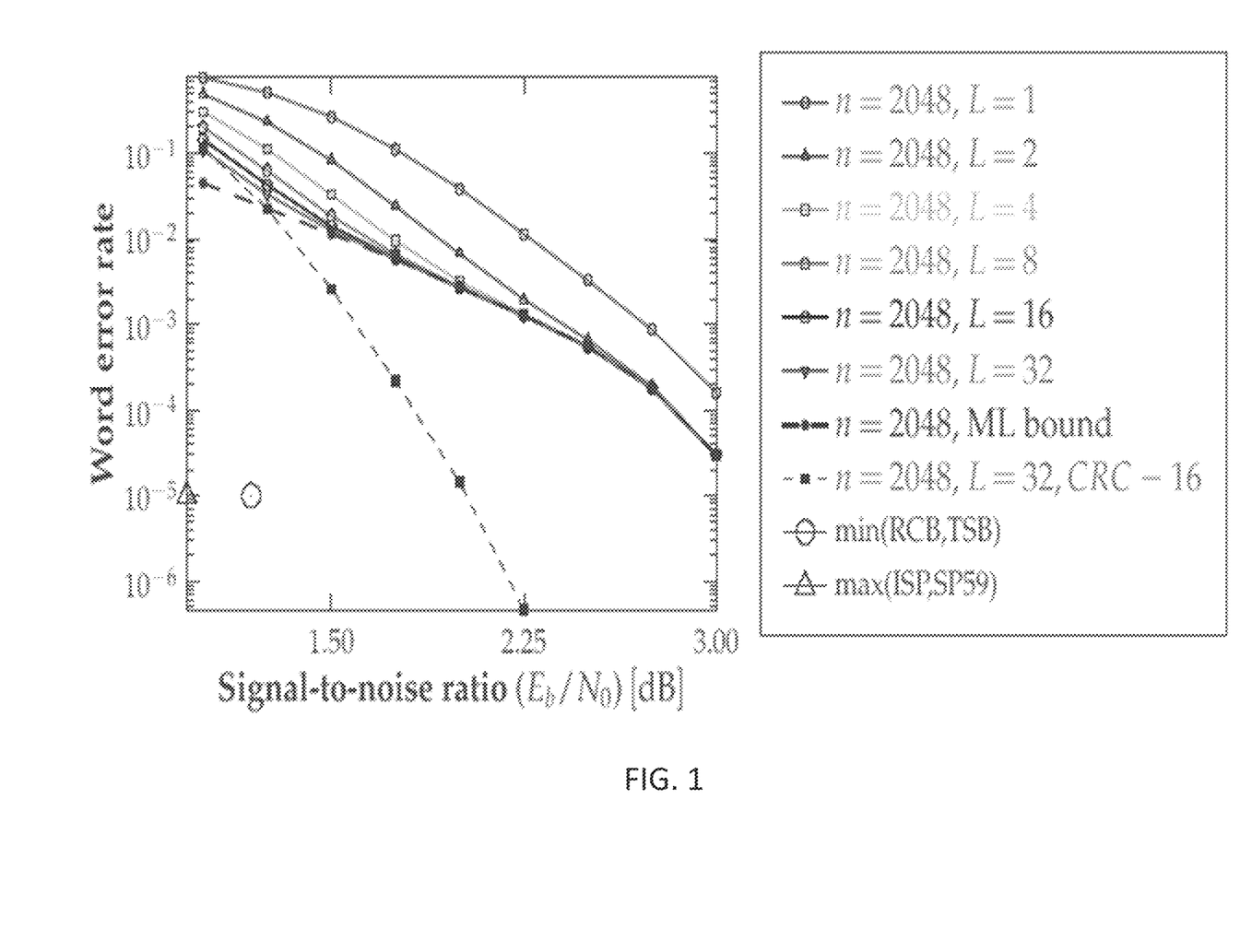
FIG. 1 shows word error rate at a length n=2048 rate ½ polar code optimized for SNR=2 dB under various list sizes for a code construction consistent with I. Tal and A. Vardy, "How to construct polar codes," submitted to IEEE Trans. Inform. Theory, available online as arXiv:1105.6164v2 (2011); with two dots representing upper and lower bounds on the SNR needed to reach a word error rate of $10^{-5}$.
Figure 2:
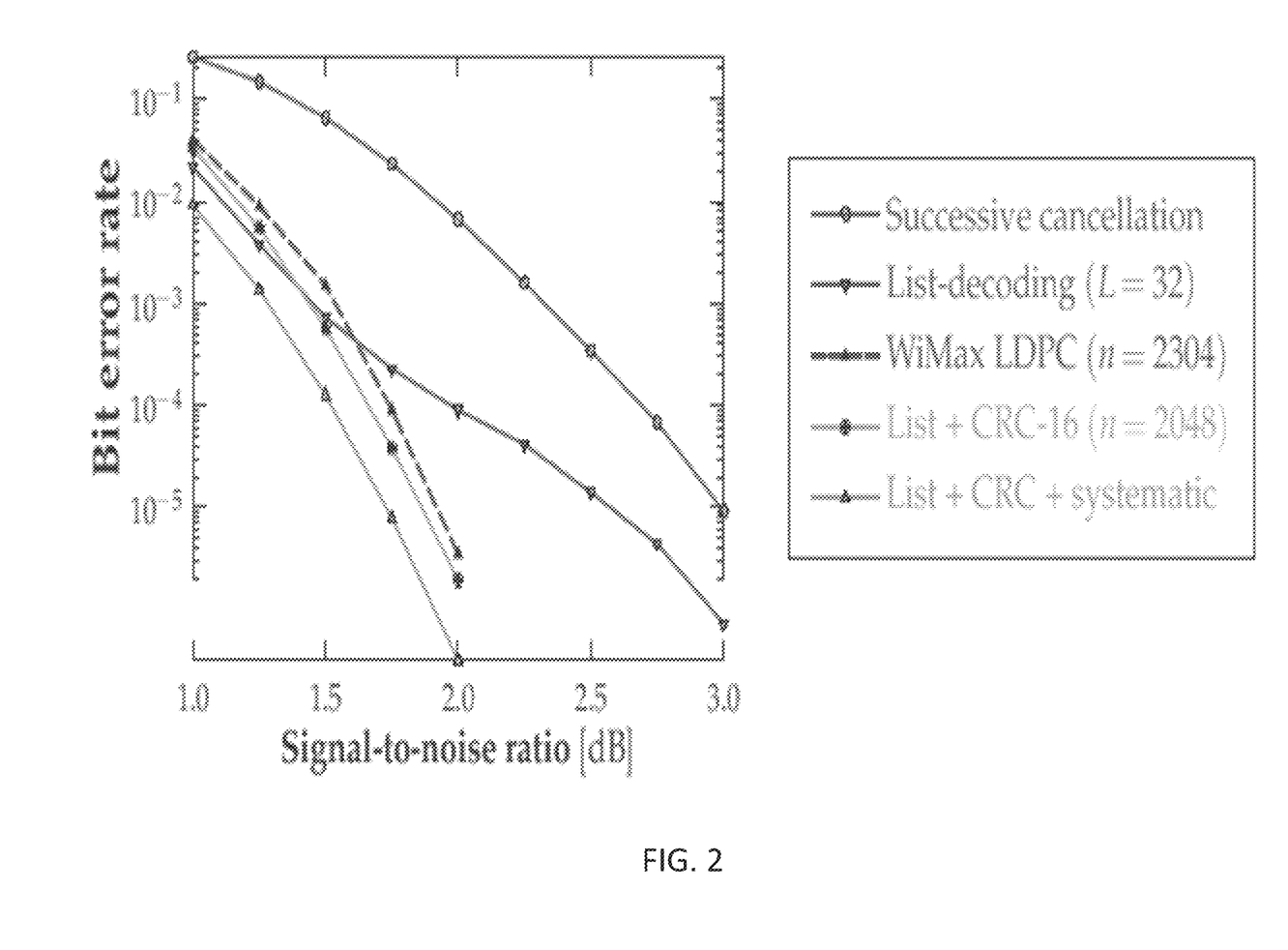
FIG. 2 shows a comparison of polar coding in according with present embodiments and decoding schemes to an implementation of the WiMax standard from TurboBest, "IEEE 802.16e LDPC Encoder/Decoder Core." [Online], with codes of rate ½, a length of the polar code is 2048, the length of the WiMax code is 2034, a list size used was L=32, and a CRC use was 16 bits long.

FIGS. 1 and 2 contain a comparison of decoding performance between the original polar codes and the preferred concantated polar codes of the invention. A further improvement in bit-error-rate (but not in block-error-rate) can be obtained when the decoding is performed systematically as in E. Arikan, "Systematic polar coding," IEEE Commmun. Lett., vol. 15, pp. 860-862, (2011).

Advantageously, when the preferred algorithm finishes it outputs a single codeword. In addition, its performance approaches an ML decoder even with modest L values.

The solid line in FIG. 1 correspond to choosing the most likely codeword from the list as the decoder input. As can be seen, this choice of the most likely codeword results in a large range in which the present algorithm has performance very close to that of the ML decoder, even for moderate values of L. Thus, the sub-optimality of the SC decoder indeed does play a role in the disappointing performance of polar codes.

The invention also shows that polar-codes themselves are weak. Instead of picking the most likely codeword from the list, an intelligent selector can select the codeword in the list that was the transmitted codeword (if the transmitted codeword was indeed present in the list). Implementing such an intelligent selector turns out to be a minor structural change of the polar code with a minor penalty in preferred embodiments, and entails a modification of the polar code. With this modification, the performance of polar codes is comparable to state of the art LDPC codes, as can be seen in FIG. 2.

Figure 3:
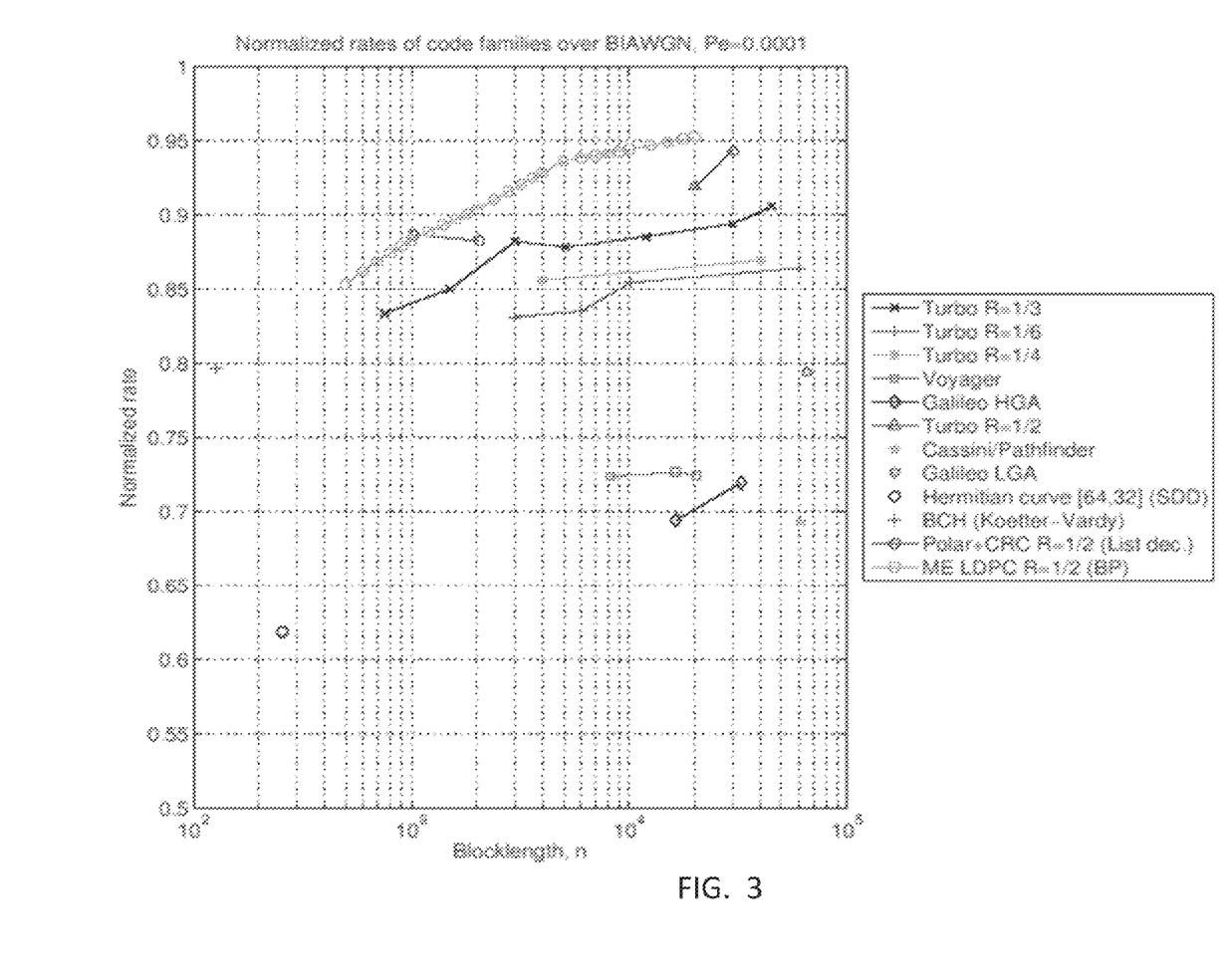
FIG. 3 shows a comparison of normalized rate for a wide class of codes with a target word error rate is $10^{-4}$.

FIG. 3 shows that there are LDPC codes of length 2048 and rate ½ with better performance that the present polar codes. However, to the best of our knowledge, for length 1024 and rate ½, the present implementation is slightly better than previously known codes when considering a target error rate probability of $10^{-4}$.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

Algorithms

Algorithm 1: A high-level description of the SC decoder

Input: the received vector y
Output: a decoded codeword $\hat{c}$
1  for $\phi = 0, 1, \ldots, n - 1$ do
2  | calculate $W_m^{(\phi)}(y_0^{n-1}, \hat{u}_0^{\phi-1}|0)$ and $W_m^{(\phi)}(y_0^{n-1}, \hat{u}_0^{\phi-1}|1)$
3  | if $\hat{u}_\phi$ is frozen then
4  |   set $\hat{u}_\phi$ to the frozen value of $u_\phi$
5  | else
6  |   if $W_m^{(\phi)}(y_0^{n-1}, \hat{u}_0^{\phi-1}|0) > W_m^{(\phi)}(y_0^{n-1}, \hat{u}_0^{\phi-1}|1)$ then
7  |     set $\hat{u}_\phi \leftarrow 0$
8  |   else
9  |     set $\hat{u}_\phi \leftarrow 1$
10 return the codeword $\hat{c}$ corresponding to $\hat{u}$ Algorithm 2: First implementation of SC decoder Input: the received vector y
Output: a decoded codeword $\hat{c}$
1  for $\beta = 0, 1, \ldots, n - 1$ do  // Intialization
2  | $P_0[\langle 0, \beta \rangle][0] \leftarrow W(y_\beta|0), P_0[\langle 0, \beta \rangle][1] \leftarrow W(y_\beta|1)$
3  for $\phi = 0, 1, \ldots, n - 1$ do  // Main loop
4  | recursivelyCalcP(m, $\phi$)
5  | if $u_\phi$ is frozen then
6  |   set $B_m[\langle \phi, 0 \rangle]$ to the frozen value of $u_\phi$
7  | else
8  |   if $P_m[\langle \phi, 0 \rangle][0] > P_m[\langle \phi, 0 \rangle][1]$ then
9  |     set $B_m[\langle \phi, 0 \rangle] \leftarrow 0$
10 |   else
11 |     set $B_m[\langle \phi, 0 \rangle] \leftarrow 1$
12 | if $\phi$ mod 2 = 1 then
13 |   recursivelyUpdateB(m, $\phi$)
14 return the decoded codeword: $\hat{c} = (B_0[\langle 0, \beta \rangle])_{\beta=0}^{n-1}$ Algorithm 3: recursivelyCalcP($\lambda, \phi$) implementation I Input: layer $\lambda$ and phase $\phi$
1  if $\lambda = 0$ then return  // Stopping condition
2  set $\psi \leftarrow \lfloor \phi/2 \rfloor$
   // Recurse first, if needed
3  if $\phi$ mod 2 = 0 then recursivelyCalcP($\lambda - 1, \psi$)
4  for $\beta = 0, 1, \ldots, 2^{m-\lambda} - 1$ do  // calculation
5  | if $\phi$ mod 2 = 0 then  // apply Equation (4)
6  |   for u' $\in \{0, 1\}$ do
7  |     $P_\lambda[\langle \phi, \beta \rangle][u'] \leftarrow \Sigma_{u''} \frac{1}{2} P_{\lambda-1}[\langle \psi, 2\beta \rangle][u' \oplus u''] \cdot P_{\lambda-1}[\langle \psi, 2\beta + 1 \rangle][u''']$
8  | else  // apply Equation (5)
9  |   set u' $\leftarrow B_\lambda[\langle \phi - 1, \beta \rangle]$
10 |   for u'' $\in \{0, 1\}$ do
11 |     $P_\lambda[\langle \phi, \beta \rangle][u''] \leftarrow \frac{1}{2} P_{\lambda-1}[\langle \psi, 2\beta \rangle][u' \oplus u''] \cdot P_{\lambda-1}[\langle \psi, 2\beta + 1 \rangle][u'']$

| Algorithm 4: recursivelyUpdateB($\lambda$, $\phi$) implementation I |
|---|
| Require : $\phi$ is odd |
| 1   set $\psi \leftarrow [\phi/2]$ |
| 2   for $\beta = 0, 1, \ldots, 2^{m-\lambda} - 1$ do |
| 3      $B_{\lambda-1}[\langle\psi, 2\beta\rangle] \leftarrow B_\lambda[\langle\phi - 1, \beta\rangle] \oplus B_\lambda[\langle\phi, \beta\rangle]$ |
| 4      $B_{\lambda-1}[\langle\psi, 2\beta + 1\rangle] \leftarrow B_\lambda[\langle\phi, \beta\rangle]$ |
| 5   if $\psi \bmod 2 = 1$ then |
| 6      recursivelyUpdateB($\lambda - 1$, $\psi$) |

| Algorithm 5: Space efficient SC decoder, main loop |
|---|
| Input: the received vector y |
| Output: a decoded codeword $\hat{c}$ |
| 1   for $\beta = 0, 1, \ldots, n - 1$ do // Initialization |
| 2      set $P_0[\beta][0] \leftarrow W(y_\beta\|0)$, $P_0[\beta][1] \leftarrow W(y_\beta\|1)$ |
| 3   for $\phi = 0, 1, \ldots, n - 1$ do // Main loop |
| 4      recursivelyCalcP(m, $\phi$) |
| 5      if $u_\phi$ is frozen then |
| 6         set $C_m[0][\phi \bmod 2]$ to the ferozen value of $u_\phi$ |
| 7      else |
| 8         if $P_m[0][0] > P_m[0][1]$ then |
| 9            set $C_m[0][\phi \bmod 2] \leftarrow 0$ |
| 10        else |
| 11           set $C_m[0][\phi \bmod 2] \leftarrow 1$ |
| 12      if $\phi \bmod 2 = 1$ then |
| 13         recursivelyUpdateC(m, $\phi$) |
| 14   return the decoded codeword: $\hat{c} = (C_0[\beta][0])_{\beta=0}^{n-1}$ |

| Algorithm 6: recursivelyCalcP($\lambda$, $\phi$) space-efficient |
|---|
| Input: layer $\lambda$ and phase $\phi$ |
| 1   if $\lambda = 0$ then return // Stopping condition |
| 2   set $\psi \leftarrow [\phi/2]$ |
|    // Recurse first, if needed |
| 3   if $\phi \bmod 2 = 0$ then recursivelyCalcP($\lambda - 1$, $\psi$) |
|    // Perform the calculation |
| 4   for $\beta = 0, 1, \ldots, 2^{m-\lambda} - 1$ do |
| 5      if $\phi \bmod 2 = 0$ then   // apply Equation (4) |
| 6         for $u' \in \{0, 1\}$ do |
| 7            $P_\lambda[\beta][u'] \leftarrow$ |
|                $\sum_{u''} \frac{1}{2} P_{\lambda-1}[2\beta][u' \oplus u''] \cdot P_{\lambda-1}[2\beta + 1][u'']$ |
| 8      else   // apply equation (5) |
| 9         set $u' \leftarrow C_\lambda[\beta][0]$ |
| 10        for $u'' \in \{0, 1\}$ do |
| 11           $P_\lambda[\beta][u''] \leftarrow \frac{1}{2} P_{\lambda-1}[2\beta][u' \oplus u''] \cdot P_{\lambda-1}[2\beta+1][u'']$ |

| Algorithm 7: recursivelyUpdateC($\lambda$, $\phi$) space-efficient |
|---|
| Input: layer $\lambda$ and phase $\phi$ |
| Require: $\phi$ is odd |
| 1   set $\psi \leftarrow [\phi/2]$ |
| 2   for $\beta = 0, 1, \ldots, 2^{m-\lambda} - 1$ do |
| 3      $C_{\lambda-1}[2\beta][\psi \bmod 2] \leftarrow C_\lambda[\beta][0] \oplus C_\lambda[\beta][1]$ |
| 4      $C_{\lambda-1}[2\beta + 1][\psi \bmod 2] \leftarrow C_\lambda[\beta][1]$ |
| 5   if $\psi \bmod 2 = 1$ then |
| 6      recursivelyUpdateC($\lambda - 1$, $\psi$) |

| Algorithm 8: initiaizeDataStructures( ) |
|---|
| 1   inactivePathIndices $\leftarrow$ new stack with capacity L |
| 2   activePath $\leftarrow$ new boolean array of size L |
| 3   arrayPointer_P $\leftarrow$ new 2-D array of size (m + 1) × L, the |

| Algorithm 8: initiaizeDataStructures( ) |
|---|
|    elements of which are array pointers |
| 4   array Pointer_C $\leftarrow$ new 2-D array of size (m + 1) × L, the elements of which are array pointers |
| 5   pathIndexToArrayIndex $\leftarrow$ new 2-D array of size (m + 1) × L |
| 6   inactiveArrayIndices $\leftarrow$ new array of size m + 1, the elements of which are stacks with capacity L |
| 7   arrayReferencsCount $\leftarrow$ new 2-D array of size (m + 1) × L |
|    // Initialization of data structures |
| 8   for $\lambda = 0, 1, \ldots, m$ do |
| 9      for $s = 0, 1, \ldots, L - 1$ do |
| 10        arrayPointer_P[$\lambda$][s] $\leftarrow$ new array of float pairs of size $2^{m-\lambda}$ |
| 11        arrayPointer_C[$\lambda$][s] $\leftarrow$ new array of bit pairs of size $2^{m-\lambda}$ |
| 12        arrayReferenceCount[$\lambda$][s] $\leftarrow 0$ |
| 13        push(inactiveArrayIndices[$\lambda$], s) |
| 14   for $l = 0, 1, \ldots, L - 1$ do |
| 15      activePath[l] $\leftarrow$ false |
| 16      push(inactivePathIndices, l) |

| Algorithm 9: assignInitialPath( ) |
|---|
| Output: index l of initial path |
| 1   l $\leftarrow$ pop(inactivePathIndices) |
| 2   active-Path[l] $\leftarrow$ true |
|    // Associate arrays with path index |
| 3   for $\lambda = 0, 1, \ldots, m$ do |
| 4      s $\leftarrow$ pop(inactiveArrayIndices[$\lambda$]) |
| 5      pathIndexToArrayIndex[$\lambda$][l] $\leftarrow$ s |
| 6      arrayReferenceCount[$\lambda$][s] $\leftarrow 1$ |
| 7   return l |

| Algorithm 10: clonePath(l) |
|---|
| Input: index l of path to clone |
| Output: index l' of copy |
| 1   l' $\leftarrow$ pop(inactivePathIndices) |
| 2   activePath[l'] $\leftarrow$ true |
|    // Make l' referencc same arrays as l |
| 3   for $\lambda = 0, 1, \ldots, m$ do |
| 4      s $\leftarrow$ pathIndexToArrayIndex[$\lambda$][l] |
| 5      pathIndexToArrayIndex[$\lambda$][l'] $\leftarrow$ s |
| 6      arrayReferenceCount[$\lambda$][s]++ |
| 7   return l' |

| Algoiittim 11: killPath(l) |
|---|
| Input: index l of path to kill |
| // Mark the path index l as inactive |
| 1   activePath[l] $\leftarrow$ false |
| 2   push(inactive PathIndices,l) |
| // Disassociate arrays with path index |
| 3   for $\lambda = 0, 1, \ldots, m$ do |
| 4      s $\leftarrow$ pathIndexToArrayIndex[$\lambda$][l] |
| 5      arrayReferenceCount[$\lambda$][s] -- |
| 6      if arrayReferenceCount[$\lambda$][s] = 0 then |
| 7         push(inactiveArrayIndices[$\lambda$], s) |

| Algorithm 12: getArrayPointer_P($\lambda$, l) |
|---|
| Input: layer $\lambda$ and path index l |
| Output: pointer to corresponding probability pair array |

-continued

Algorithm 12: getArrayPointer_P($\lambda$, l)

```
    // getArrayPointer_C(λ, l) is defined
    identically, up to the obvious changes
    in lines 6 and 10
 1  s ← pathIndexToArrayIndex[λ][l]
 2  if arrayReferenceCount[λ][s] = 1 then
 3  |   s' ← s
 4  else
 5  |   s' ← pop(inactiveArrayIndices[λ])
 6  |   copy the contents of the array pointed to by
    |   arrayPointer_P[λ][s] into that pointed to by
    |   arrayPointer_P[λ][s']
 7  |   arrayReferenceCount[λ][s]--
 8  |   arrayReferenceCount[λ][s'] ← 1
 9  |_  pathIndexToArrayIndex[λ][l] ← s'
10  return arrayPointer_P[λ][s']
```

Algorithm 13: pathIndexInactive(l)

```
    Input: path index l
    Output: true if path l is active, and false otherwise
 1  if activePath[l] = true then
 2  |   return false
 3  else
 4  |_  return true
```

Algorithm 14: recursivelyCalcP($\lambda$, $\phi$) list version

```
    Input: layer λ and phase φ
 1  if λ = 0 then return  // stopping condition
 2  set ψ ← [φ/2]
    // Recurse first, if needed
 3  if φ mod 2 = 0 then recursivelyCalcP(λ − 1, ψ)
    // Perform the calculation
 4  σ ← 0
 5  for l = 0, 1, . . . , L − 1 do
 6  |   if pathIndexInactive(l) then
 7  |   |_  continue
 8  |   P_λ ← getArrayPointer_P(λ, l)
 9  |   P_{λ−1} ← getArrayPointer_P(λ − 1, l)
10  |   C_λ ← getArrayPointer_C(λ, l)
11  |   for β = 0, 1, . . . , 2^{m−λ} − 1 do
12  |   |   if φ mod 2 = 0 then
    |   |   |                // apply Equation (4)
13  |   |   |   for u' ∈ {0, 1} do
14  |   |   |   |   P_λ[β][u'] ←
    |   |   |   |   Σ_{u''} ½P_{λ−1}[2β][u' ⊕ u''] · P_{λ−1}[2β + 1][u'']
15  |   |   |   |_  σ ← max (σ, P_λ[β][u'])
16  |   |   else        // apply equation (5)
17  |   |   |   set u' ← C_λ[β][0]
18  |   |   |   for u'' ∈ {0, 1} do
19  |   |   |   |   P_λ[β][u''] ←
    |   |   |   |   ½ P_{λ−1}[2β][u' ⊕ u''] · P_{λ−1}[2β + 1][u'']
20  |   |   |   |_  σ ← max(σ, P_λ[β][u''])
    |   |   |_
    |   |_
    // normalize probabilities
21  for l = 0, 1, . . . , L − 1 do
22  |   if pathIndexInactive(l) then
23  |   |_  continue
24  |   P_λ ← getArrayPointer_P(λ, l)
25  |   for β = 0, 1, . . . , 2^{m−λ} − 1 do
26  |   |   for u ∈ {0, 1} do
27  |   |   |_  P_λ[β][u] ← P_λ[β][u]/σ
    |   |_
    |_
```

Algorithm 15: recursivelyUpdateC($\lambda$, $\phi$) list version

```
    Input: layer λ and phase φ
    Require: φ is odd
 1  set C_λ ← getArrayPointer_C(λ, l)
 2  set C_{λ−1} ← getArrayPointer_C(λ − 1, l)
 3  set ψ ← [φ/2]
 4  for l = 0, 1, . . . , L − 1 do
 5  |   if pathIndexInactive(l) then
 6  |   |_  continue
 7  |   for β = 0, 1, . . . , 2^{m−1} − 1 do
 8  |   |   C_{λ−1}[2β][ψ mod 2] ← C_λ[β][0] ⊕ C_λ[β][1]
 9  |   |_  C_{λ−1}[2β + 1][ψ mod 2] ← C_λ[β][1]
    |_
10  if ψ mod 2 = 1 then
11  |_  recursivelyUpdateC(λ − 1, ψ)
```

Algorithm 16: SCL decoder, main loop

```
    Input: the received vector y and a list size L, as a global
    Output decoded codeword, ĉ
    // Initialization
 1  initializedDataStructures( )
 2  l ← assignInitialPath( )
 3  P_0 ← getArrayPointer_P(0, l)
 4  for β = 0, 1, . . . , n − 1 do
 5  |_ set P_0[β][0] ← W(y_β|0), P_0[β][1] ← W(y_β|1)
    // Main loop
 6  for φ = 0, 1, . . . , n − 1 do
 7  |   recursivelyCalcP(m, φ)
 8  |   if u_φ is frozen then
 9  |   |   continuePaths_FrozenBit(φ)
10  |   else
11  |   |_  continuePaths_UnfrozenBit(φ)
12  |   if φ mod 2 = 1 then
13  |   |_  recursivelyUpdateC (m, φ)
    |_
    // Return the best codeword in the list
14  l ← findMostProbablePath( )
15  set C_0 ← getArrayPointer_C(0, l)
16  return ĉ = (C_0[β][0])_{β=0}^{n−1}
```

Algorithm 17: continuePaths_FrozenBit($\phi$)

```
    Input: phase φ
 1  for l = 0, 1, . . . , L − 1 do
 2  |   if pathIndexInactive(l) then continue
 3  |   C_m ← getArrayPointer_C(m, l)
 4  |_  set C_m[0][φ mod 2] to the frozen value of u_φ
```

Algorithm 18: continuePaths_UnfrozenBit($\phi$)

```
    Input: phase φ
 1  probForks ← new 2-D float array of size L × 2
 2  i ← 0
    // populate probForks
 3  for l = 0, 1, . . . , L − 1 do
 4  |   if pathIndexInactive(l) then
 5  |   |   probForks [l][0] ← −1
 6  |   |   probForks [l][1] ← −1
 7  |   else
 8  |   |   P_m ← getArrayPointer_P(m, l)
 9  |   |   probForks [l][0] ← P_m[0][0]
10  |   |   probForks [l][1] ← P_m[0][1]
11  |   |_  i ← i + 1
    |_
12  ρ ← min(2i, L)
13  ContForks ← new 2-D boolean array of size L × 2
    // The following is possible in O(L) time
```

| Algorithm 18: continuePaths_UnfrozenBit(φ) |
|---|

```
14   populate contForks such that contForks[l][b] is true iff
     probForks [l][b] is one of the ρ largest entries in probForks
     (and ties are broken arbitrarily)
     // First, kill-off non-continuing paths
15   for l = 0, 1, . . . , L − 1 do
16   |   if pathIndexInactive(l) then
17   |   |_  continue
18   |   if contForks[l][0] = false and contForks[l][1] = false
     |   then
19   |   |_  killPath(l)
     |_
     //  Then, continue relevant paths, and
         duplicate if necessary
20   for l = 0, 1, . . . , L − 1 do
21   |   if contForks[l][0] = false and contForks[l][1] = false
     |   then // both forks are bad, or invalid
22   |   |_  continue
23   |   C_m ← getArrayPointer_C(m, l)
24   |   if contForks[l][0] = true and contForks[l][1] = true then
     |   // both forks are good
25   |   |   set C_m[0][φ mod 2] ← 0
26   |   |   l' ← clonePath(l)
27   |   |   C_m ← getArrayPointer_C(m, l')
28   |   |   set C_m[0][φ mod 2] ← 1
29   |   else// exactly one fork is good
30   |   |   if ContForks[l][0] = true then
31   |   |   |   set C_m[0][φ mod 2] ← 0
32   |   |   else
33   |   |   |_  set C_m[0][φ mod 2] ← 1
     |   |_
     |_
```

| Algorithm 19: findMostProbablePath( ) |
|---|

```
     Output: the index l' of the most pobable path
1    l' ← 0, p' ← 0
2    for l = 0, 1, . . . , L − 1 do
3    |   if pathIndexInactive(l) then
4    |   |   continue
5    |   C_m ← getArrayPointer_C(m, l)
6    |   P_m ← getArrayPointer___P(m, l)
7    |   if p' < P_m[0][C_m[0][1]] then
8    |   |_  l' ← l, p' ← P_m[0][C_m[0][1]]
     |_
9    return l'
```

The invention claimed is:

1. A method of decoding data encoded with a polar code, the method being implemented via code stored on a non-transient medium in a receiver and comprising:

receiving a word of polar encoded data from a channel and conducting decoding of the word by following several distinct decoding paths to generate codeword candidates;

list decoding by successively duplicating and pruning said decoding paths to generate a list of potential decoding paths, selecting a single decoding path from the list of potential decoding paths and thereby identifying a single codeword output.

2. The method of claim 1, wherein said duplicating and pruning splits a decoding path into two child paths to be examined for each decision on the value of an unfrozen bit.

3. The method of claim 2, wherein the list decoding assigns child paths duplicate data structures each time a decoding path splits; each assigned duplicate data structure is flagged as belonging to multiple paths without copying the data structures at the time of assignment; and a copy of an assigned duplicate data structure is made only when a selected decoding path requires access to an assigned duplicate data structure during decoding.

4. The method of claim 1, wherein said duplicating and pruning doubles the number of decoding paths at each decoding step, and then performs pruning procedure to discard all but the L best paths.

5. The method of claim 1, wherein the pruning is performed using an accumulated likelihood of each path.

6. The method of claim 1, implemented in a cellular network device.

7. The method of claim 1, wherein the word of polar coded data includes k-r unfrozen bits of k unfrozen bits as data bits and r bits of redundancy data; and wherein the pruning uses the redundancy data for decoding decisions to prune the list of potential decoding paths.

8. The method of claim 7, wherein said pruning discards all paths with incorrect cyclic redundancy check values.

9. A method for encoding and decoding data using polar codes, the method being implemented via code stored on a non-transient medium in a receiver and comprising:

reserving k-r unfrozen bits of k unfrozen bits available as data bits;

using the remaining r unfrozen bits to add redundancy to the data bits; and then using said redundancy to aid in the selection of a decoding path from a list of decoding paths generated during the decoding.

10. The method of claim 9, wherein the redundancy bits are assigned to cyclic redundancy check (CRC) values of the data.

11. The method of claim 10, wherein all the decoding paths with incorrect cyclic redundancy check values are discarded.

12. The method of claim 9, implemented in a cellular network device.

13. A polar decoding device for receiving polar coded data from a channel, the decoding device comprising:

means for list decoding the polar coded data; and
means for successively duplicating and pruning decoding paths during decoding.

* * * * *

UNITED STATES PATENT AND TRADEMARK OFFICE
CERTIFICATE OF CORRECTION

PATENT NO. : 9,503,126 B2
APPLICATION NO. : 13/938609
DATED : November 22, 2016
INVENTOR(S) : Vardy et al.

Page 1 of 1

It is certified that error appears in the above-identified patent and that said Letters Patent is hereby corrected as shown below:

In the Specification

Column 1, Lines 12-16, delete:
"STATEMENT OF GOVERNMENT INTEREST
This invention was made with government support under CCF-1116820 awarded by National Science Foundation. The government has certain rights in the invention."

Signed and Sealed this
Twentieth Day of February, 2018

Andrei Iancu
*Director of the United States Patent and Trademark Office*